(12) United States Patent
Basceri et al.

(10) Patent No.: US 7,323,064 B2
(45) Date of Patent: Jan. 29, 2008

(54) SUPERCRITICAL FLUID TECHNOLOGY FOR CLEANING PROCESSING CHAMBERS AND SYSTEMS

(75) Inventors: Cem Basceri, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 335 days.

(21) Appl. No.: 10/636,028

(22) Filed: Aug. 6, 2003

(65) Prior Publication Data

US 2005/0028927 A1 Feb. 10, 2005

(51) Int. Cl.
*B08B 7/00* (2006.01)

(52) U.S. Cl. .............. 134/1; 134/2; 134/22.1

(58) Field of Classification Search ............ 134/1, 134/34, 26, 22.1, 1.3, 2; 438/905, 904
See application file for complete search history.

(56) References Cited

U.S. PATENT DOCUMENTS

| | | | |
|---|---|---|---|
| 4,776,883 A | | 10/1988 | Hayashi et al. |
| 5,013,366 A | * | 5/1991 | Jackson et al. ............. 134/1 |
| 5,108,512 A | * | 4/1992 | Goffnett et al. ............. 134/7 |
| 5,356,478 A | * | 10/1994 | Chen et al. ............. 134/1 |
| 5,417,768 A | * | 5/1995 | Smith et al. ............. 134/10 |
| 5,908,510 A | * | 6/1999 | McCullough et al. ............. 134/2 |
| 6,067,728 A | | 5/2000 | Farmer et al. |
| 6,242,165 B1 | * | 6/2001 | Vaartstra ............. 430/329 |
| 6,454,869 B1 | * | 9/2002 | Cotte et al. ............. 134/2 |
| 6,926,014 B2 | * | 8/2005 | Cheng et al. ............. 134/22.18 |
| 7,060,422 B2 | * | 6/2006 | Biberger et al. ............. 430/329 |

OTHER PUBLICATIONS

Knutson, B. et al. "The Use of Supercritical Carbon Dioxide-Based Solvents as a Cost Effective and Environmentally Sound Alternative to Current Photoresist Stripping Solvents", http://www.uwstout.edu/rps/uwsjsr/knutson.pdf, Apr. 14, 2003, 7 pages.

Fahlman, B. "Supercritical fluid technology", Today's Chemist At Work, Feb. 2002, vol. 11, No. 2, pp. 81-82, 84.

http://www.irf.uro.uidaho.edu/TAFL/IC_Metallization/default.htm, May 28, 2003, 3 pages.

Wai, C. et al., "Supercritical carbon dioxide extraction of caesium from aqueous solutions in the presence of macrocyclic and fluorinated compounds", Mendeleev Communications Electronic Version, Issue 5, 1999 (pp. 171-212).

(Continued)

Primary Examiner—Michael Barr
Assistant Examiner—Saeed Chaudhry
(74) Attorney, Agent, or Firm—Wells St. John P.S.

(57) ABSTRACT

The invention includes a method of cleaning a processing chamber by introducing supercritical fluid into the processing chamber. A residue over an internal chamber surface is contacted with the supercritical fluid to remove the residue from the surface. The invention also includes a method of removing deposited material from internal surfaces of a processing system. A cleaning agent comprising at least one of $C_3H_8$, $C_2H_6$ and $CH_4$ is provided in supercritical phase into at least a portion of the processing system. A material deposited on an internal surface of the processing system is contacted with the cleaning agent to remove at least a portion of the deposited material.

15 Claims, 2 Drawing Sheets

OTHER PUBLICATIONS

Clifford, A. et al., "Modeling of the Extraction of Uranium with Supercritical Carbon Dioxide", Journal of Nuclear Science and Technology, vol. 38, No. 6, p. 433-438, Jun. 2001.

Biberger, M., "Photoresist and Photoresist Residue Removal with Supercritical $CO_2$—A Novel Approach to Cleaning Wafers", Semiconductor Fabtech—12th Edition, pp. 239-243.

Ye, X., "Decorating catalytic palladium nanoparticles on carbon nanotubes in supercritical carbon dioxide", The Royal Society of Chemistry, 2003, pp. 642-643.

Carson, T. et al., "Surfactants for Supercritical and Near-Critical Fluids", Surfactant Science Series, vol. 100, pp. 129-143.

Wagner, Julie, "New and Innovative Technologies for Mixed Waste Treatment", Aug. 1997, University of Michigan School of Natural Resources and Environment for EPA Office of Solid Waste Permits and State Programs Division.

Gurganus, Thomas B., "Aluminum Powder Applications", Advanced Materials & Processes, Aug. 1995, pp. 5759.

Pluym, T. et al., "Siver-palladium alloy particle production by spray pyrolysis", Journal of Material Resources, vol. 10, No. 7, Jul. 1995, pp. 1661-1673.

Ji, M. et al., "Synthesizing and Dispersing Silver Nanoparticles in a Water-in-Supercritical Carbon Dioxide Microemulsion", Journal of American Chemical Society, Mar. 1999, vol. 121, No. 11, pp. 2631-2632.

Fernandes, N. et al., "Reactive Deposition of Metal Thin Films within Porous Supports from Supercritical Fluids", Chemical Materials, May 2001, vol. 13, No. 6, pp. 2023-2031.

Banister, J. et al., "Flow Reactors for preparative Chemistry in Supercritical Fluid Solution: "Solvent Free" Synthesis and Isolation of $Cr(CO)_5(C_2H_4)$ and $(n^5-C_5H_5)Mn(CO)_2(n^2-H_2)$", Organometallics, May 1995, vol. 14, No. 8, pp. 3876-3885.

\* cited by examiner

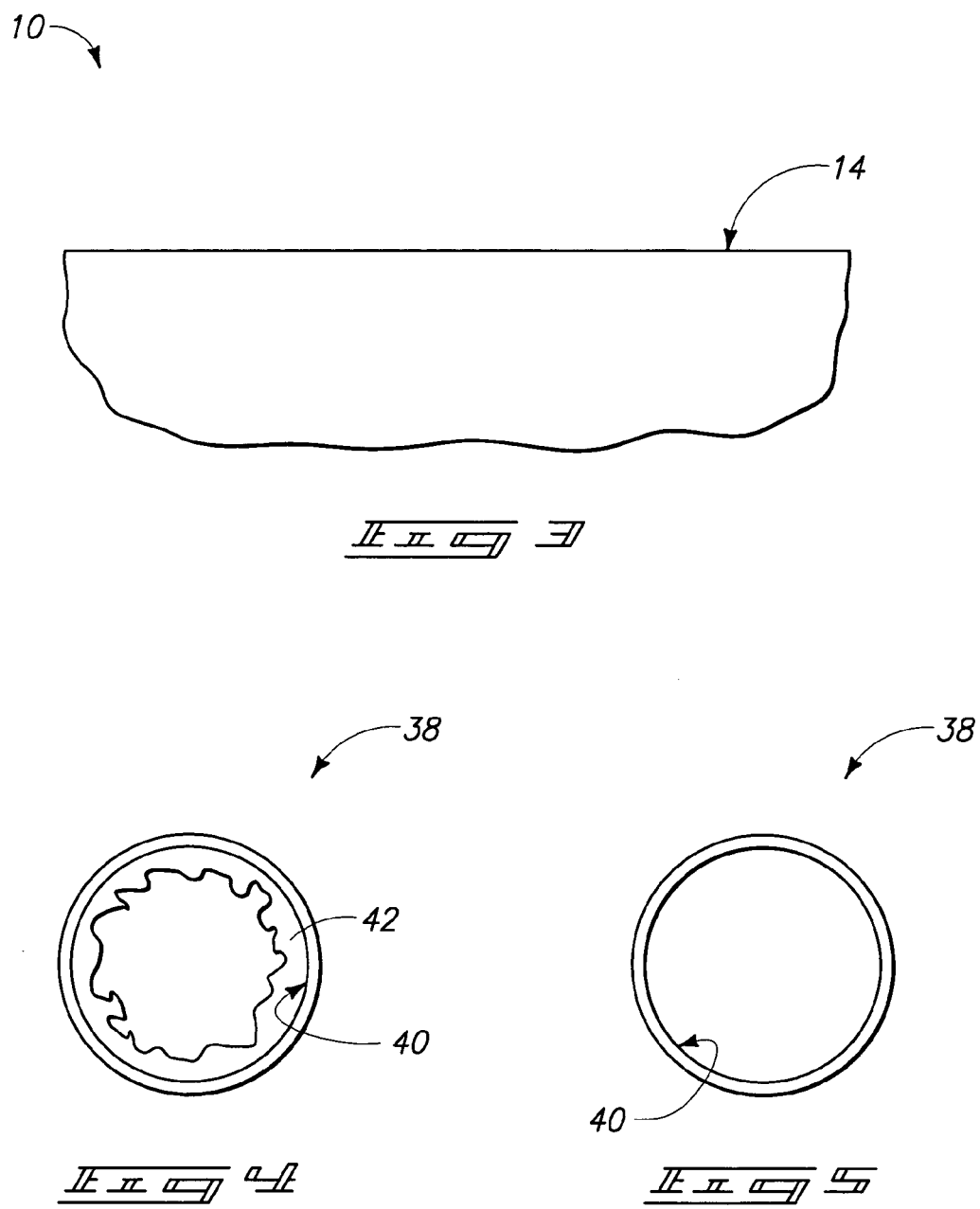

SUPERCRITICAL FLUID TECHNOLOGY FOR CLEANING PROCESSING CHAMBERS AND SYSTEMS

TECHNICAL FIELD

The invention pertains to methods of cleaning a processing chamber. In particular applications, the invention pertains to methods of cleaning semiconductor processing chambers using a supercritical fluid. The invention also pertains to removing deposited material from internal surfaces of processing systems. The invention further pertains to a processing system.

BACKGROUND OF THE INVENTION

A variety of systems are utilized in materials processing and fabrication technologies such as, for example, semiconductor processing. Exemplary processing systems include deposition systems such as various types of physical vapor deposition systems, chemical vapor deposition systems, furnaces, etc. Many of these systems include one or more processing chambers, various processing equipment and processing tools, associated interconnects, feed and/or exhaust lines, and other system components that may become contaminated during a processing event. Such contamination can be due to formation of residue materials such as one or more reagent, product or byproduct involved in or produced by the processing event. The presence of residue material on internal surfaces of the processing system can affect processing efficiency or precision, and can in some instances result in contamination of the material or device being processed.

Conventional system cleaning techniques often utilize a solvent or solvent system that is expensive, environmentally unfriendly, and/or inefficient. In some instances, systems are configured to include special components such as heated lines and/or cold traps in an attempt to reduce contamination of system components or surfaces by residue materials. Additionally, due to the intricate nature of many processing tools, equipment and internal regions of various processing systems, some areas are not highly accessible to conventional solvents, other cleaning agents or alternative techniques. Accordingly, conventional cleaning methods can be cost prohibitive and unreliable.

It would be desirable to develop alternative methods for cleaning processing systems, system components and associated tools and equipment.

SUMMARY OF THE INVENTION

In one aspect the invention encompasses a method of cleaning a processing chamber. A supercritical fluid is provided into a processing chamber which has a residue material over at least one internal chamber surface. The residue material is contacted with the supercritical fluid to remove at least some of the residue from the internal surface.

In one aspect the invention encompasses a method of removing deposited material from internal surfaces of a processing system. A cleaning agent comprising carbon dioxide is provided into at least a portion of the processing system. The carbon dioxide can be provided in liquid phase or supercritical phase. A material deposited on an internal surface of at least a portion of the processing system is contacted with the cleaning agent to solubilize at least a portion of the deposited material. The solubilized fraction is subsequently removed from the system.

In one aspect, the invention encompasses a processing system which includes a supercritical fluid source in selective fluid communication with a processing chamber. The system is configured to selectively flow supercritical fluid into the chamber during a chamber cleaning process. The system also contains a recovery vessel in fluid communication with the processing chamber.

BRIEF DESCRIPTION OF THE DRAWINGS

Preferred embodiments of the invention are described below with reference to the following accompanying drawings.

FIG. 3 is a view of the FIG. 1 system portion shown at a processing stage subsequent to that of FIG. 2.

FIG. 4 is a diagrammatic, cross-sectional view of a second exemplary fragment of system 10 shown in FIG. 1, at a preliminary processing stage of a method of the present invention.

FIG. 5 is a view of the FIG. 4 system fragment shown at a processing stage subsequent to that of FIG. 4.

DETAILED DESCRIPTION OF THE PREFERRED EMBODIMENTS

Figure 1:
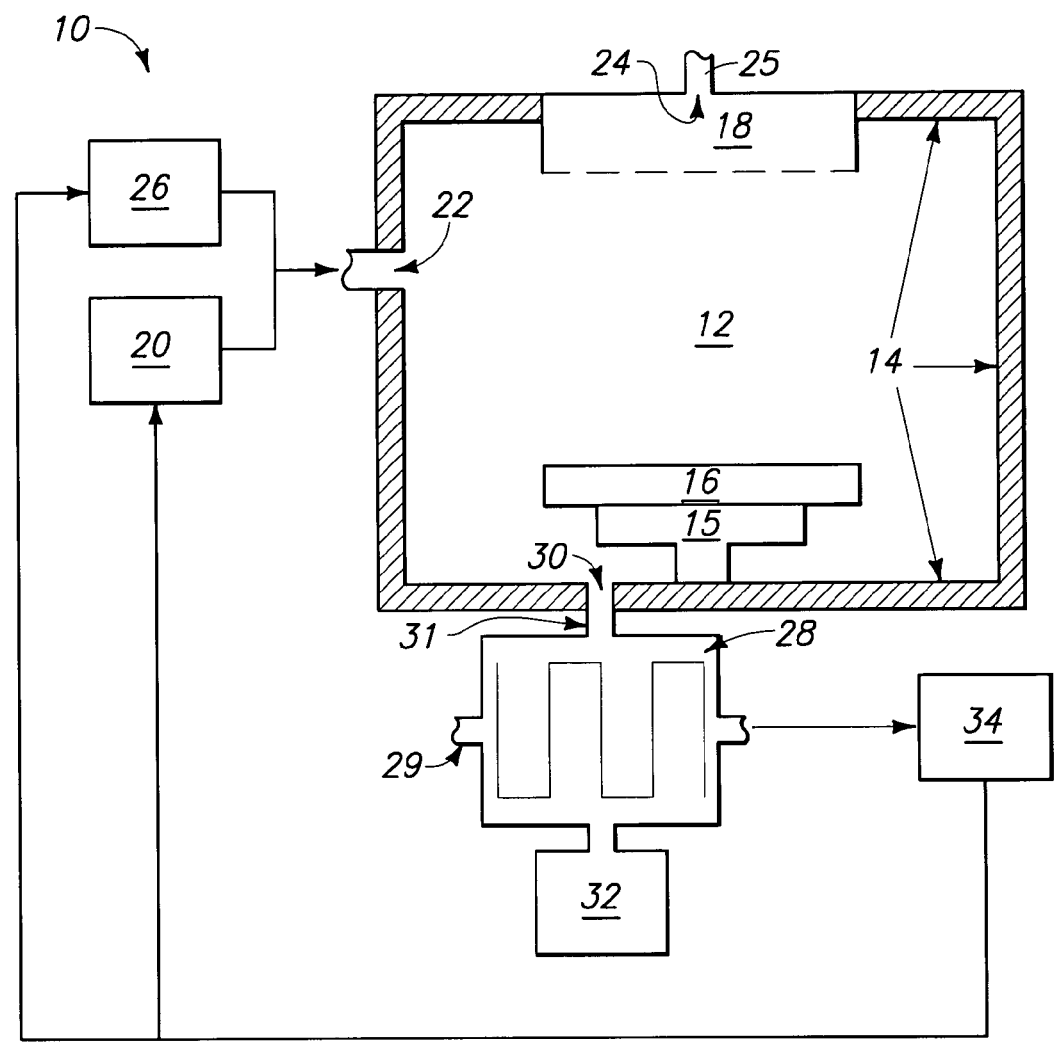
FIG. 1 is a diagrammatic, cross-sectional view of an exemplary apparatus system which can be subjected to cleaning methodology of the present invention.

This disclosure of the invention is submitted in furtherance of the constitutional purposes of the U.S. Patent Laws "to promote the progress of science and useful arts" (Article 1, Section 8).

In particular applications, the invention encompasses a process of cleaning one or more surfaces of semiconductor processing systems. The cleaning process can include exposing a surface of the processing system to a supercritical fluid. As is known to persons of ordinary skill in the art, a supercritical fluid is defined as any substance that is above its critical temperature ($T_c$) and critical pressure ($P_c$). $T_c$ is the highest temperature at which a gas can be converted to a liquid by an increase in pressure, and $P_c$ is the highest pressure at which a liquid can be converted to a traditional gas by an increase in the temperature of the liquid. The critical region for a particular substance is the region on a phase diagram for a given substance where both temperature and pressure are at or above their corresponding critical values.

In the critical region, a substance exists in a single phase which possesses properties of both a gas and a liquid. Supercritical fluids differ from traditional liquids in several aspects. For example, the solvent power of a supercritical fluid will typically increase with density at a given temperature. Additionally, supercritical fluids have very low effective viscosity and surface tension allowing penetration into very small areas and features. In particular applications, the cleaning processes of the invention can utilize a liquid cleaning agent that is near the critical point of the agent. When a liquid cleaning agent is utilized, the liquid can preferably be at a temperature greater than or equal to about 90% of $T_c$ and at a pressure greater than or equal to about 90% of $P_c$. More preferably, when a liquid cleaning agent is utilized the agent is at a sufficient temperature and pressure to assume some of the solvent, surface tension and/or diffusivity properties the agent exhibits in the supercritical state.

In particular applications of the present invention, the supercritical fluid can have at least one surfactant and/or at least one co-solvent dispersed and/or dissolved therein. For purposes of interpreting this disclosure and the claims that follow, the term "supercritical fluid" is utilized to refer specifically to a portion of composition that is in a supercritical state (i.e., is utilized to refer to the supercritical component of a composition). Typically, the materials dispersed and/or dissolved within the supercritical fluid will not be in a supercritical state and accordingly will not be part of the supercritical fluid. However, it is noted that in particular applications one or more of the materials dispersed within a supercritical fluid can themselves be in a supercritical state. In such applications the dispersed materials that are in the supercritical state will be part of the supercritical fluid.

The supercritical fluid can, in particular aspects of the invention, comprise one or more of $CO_2$, $NH_3$, $C_3H_8$, $N_2O$, $C_2H_6$, $CH_4$, $H_2O$ and Ar. In some instances, the supercritical fluid can consist essentially of, or consist of one or more of these substances. Other exemplary materials that can be formed into supercritical fluids which may be useful for purposes of the present invention include an alcohol having from 1 to 5 carbon atoms, for example, ethanol and/or methanol, isooctane, hexane, heptane, butane, propane, ethene, propene, dimethyl ether, tetrafluoromethane, difluoromethane, tetrafluoroethane, xenon, pentafluoroethane, sulfur hexafluoride, CFC-12, HCFC-22, HCFC-123, HFC-116, and HFC-134a.

In particular applications, a cleaning agent according to the invention can preferably comprise a supercritical fluid which comprises, consist essentially of, or consist of $CO_2$. In some applications the agent can comprise supercritical $CO_2$ with various additional components or "co-agents" dispersed or dissolved therein. Such co-agents can include, for example, a co-solvent and/or a surfactant. An advantage of utilizing $CO_2$ as opposed to other supercritical fluids is that $CO_2$ has a relatively low critical temperature of about 31° C. Carbon dioxide also has a convenient supercritical pressure range of from about 73 atmospheres (atm). Additional advantages of utilizing supercritical $CO_2$ include its ready availability, relative non-toxicity, and lower expense as compared to alternative solvents or cleaning technologies.

A cleaning agent consisting essentially of or consisting of a given supercritical fluid, such as $CO_2$, can be utilized to dissolve certain substances such as, for example, many organic compounds. However, in particular instances, it can be advantageous to increase the ability of a particular supercritical fluid to dissolve one or more materials by utilizing a co-solvent and/or a surfactant. In particular instances, the supercritical fluid can act as a carrier medium to carry co-solvents to areas for cleaning to occur. For example, the ability of supercritical $CO_2$ to dissolve or remove ionic materials can be increased by utilizing a more polar co-solvent in conjunction with the supercritical $CO_2$. An exemplary polar co-solvent can be water. Alternative solvents are available for use as co-solvent in conjunction with a supercritical fluid according to methodology of the present invention as will be understood by those skilled in the art.

Optionally, the co-solvent/supercritical fluid mixture described above can additionally contain one or more surfactants. A variety of surfactants are available which can be utilized in the cleaning agent of the present invention. In particular applications, the cleaning agent of the invention can include a supercritical fluid combined with one or more surfactant in the absence of any additional co-solvent. The supercritical fluid portion of a cleaning mixture according to the invention can advantageously carry dispersed or dissolved co-agents into areas that would be relatively inaccessible to liquid or conventional solvents.

An exemplary system 10 which can be utilized for purposes of the present invention is discussed with reference to FIG. 1. System 10 can be, for example, a processing system utilized during processing of materials or during device fabrication. System 10 can comprise a processing chamber 12 used for performing one or more steps in a processing event. Chamber 12 is not limited to a particular form of processing and can be a chamber utilized for one or more techniques including but not limited to material deposition, etching, annealing, photolithography, ion implantation, or chemical mechanical polishing. In particular applications, chamber 12 can be a deposition chamber utilized for processes including physical vapor deposition (PVD), chemical vapor deposition (CVD), atomic layer deposition (ALD), pulsed-CVD, plasma enhanced CVD (PECVD), or high density plasma deposition (HDP). In other instances, chamber 12 can be a furnace chamber or other batch tool. In particular embodiments of the invention, system 10 can be utilized for semiconductor processing system and chamber 12 can be a semiconductor processing chamber.

Chamber 12 can have various internal surfaces over which various unwanted residue materials can be deposited during the semiconductor processing steps performed therein. Such internal surfaces can comprise, for example, wall surfaces 14 and/or surfaces comprised by one or more system components internal to chamber 12 such as a surface of a heater 15, a surface of a substrate holder 16 and a surface of a disperser 18. Internal components 15, 16 and 18 are not limited to a particular configuration and can be, for example, any component utilized as a heater 15, as a substrate holder 16 (for example to hold one or more semiconductor wafers) or as a disperser 18 during semiconductor processing. Such internal features can be integral or removable.

In addition to the internal surfaces discussed above, the invention encompasses placement of additional processing equipment or tools into the chamber specifically for the cleaning process. Accordingly, system 10 can be utilized for cleaning within chamber 12, surfaces that were not within chamber 12 during the deposition or other processing event. For example, a semiconductor wafer holder which held one or more wafers during processing within an alternate processing chamber can be cleaned by placing such holder into chamber 12 during the cleaning process.

Processing system 10 can comprise, for example, a cleaning agent source 20. In applications where the cleaning agent will be utilized in a supercritical phase, source 20 can comprise the supercritical fluid phase of the agent and the agent can be provided into chamber 12 through inlet 22 in supercritical form. Alternatively, source 20 can provide the cleaning agent into chamber 12 in liquid form or gas form and a cleaning agent 20 can be converted to its supercritical phase within chamber 12. In applications where cleaning agent 20 will be utilized in a liquid or near supercritical form, source 20 can be a liquid or can alternatively be a gas which can be converted into a liquid by an appropriate increase in pressure within chamber 12 relative to source 20.

In applications where a co-solvent and/or a surfactant will be utilized during cleaning, system 10 can comprise a co-agent source 26 for providing the co-solvent and/or surfactant. Although FIG. 1 shows system 10 as comprising a single co-agent source, it is to be understood that the invention contemplates embodiments having two or more co-agent sources (not shown) or an absence of any co-agent source (not shown). Source 26 can provide at least one co-agent selected from the group consisting of co-solvents and surfactants. Exemplary co-solvents and surfactants utilized in system 10 can be any of those agents discussed above.

Co-agent 26 can be combined with agent 20 prior to flowing cleaning agent into chamber 12, or alternatively can be provided independently of agent 20. Co-agent 26 can be provided through common inlet 22, as shown in FIG. 1 or alternatively can be provided through an independent inlet (not shown). When provided independently, co-agent 26 can be provided simultaneously with agent 20, can be introduced into chamber 12 prior to agent 20, or in particular instances can be introduced subsequent to agent 20.

In some applications of the invention, co-agent 26 can be utilized as a pre-treatment substance. For example, one or more co-agent can be independently provided into chamber 12, and can contact and/or react with materials on surfaces internal to system 10 prior to any flowing of agent 20. Agent 20 can then be provided within a portion or all of the internal areas of system 10 to interact or mix with the co-agent. The mixture of agent and co-agent can subsequently be removed from the internal areas of the system along with any materials dissolved or dispersed therein.

Whether or not cleaning agent 20 is utilized in conjunction with a surfactant and/or a co-solvent, agent 20 can be introduced into chamber 12 in gas phase, in liquid phase or in supercritical fluid phase. Where agent 20 is introduced into chamber 12 in a non-supercritical phase and where cleaning of chamber 12 will utilize the supercritical fluid phase, temperature and pressure conditions of chamber 12 can be provided such that agent 20 is converted to the supercritical phase within chamber 12. In particular instances, it can be preferable that agent 20 be flowed or injected into chamber 12 in supercritical phase.

Processing system 10 can comprise one or more reagent inlets 24 and feed lines 25 for introduction of one or more reagents utilized during semiconductor processing or other processing events. As indicated in FIG. 1, inlet 24 can be configured such that one or more reagents are provided into chamber 12 through disperser 18. Disperser 18 is not limited to a particular type of disperser and can be, for example, a shower head type disperser. System 10 can further comprise additional internal features such as heater 15 and substrate holder 16. It is to be understood that the internal features, as well as the inlet and outlet configuration shown in FIG. 1 represents an exemplary apparatus configuration. The invention additionally encompasses utilizing cleaning methods of the present invention for processing chambers having alternate configurations and additional or different internal features. As discussed above, chamber 12 can additionally be utilized to clean items that are not internal components of system 10 by placing such items within chamber 12 for the cleaning event.

System 10 can be configured such that the cleaning fluid introduced into chamber 12 contacts at least a portion of an internal surface of inlet 24 and/or feed line 25. Additionally, in particular applications system 10 can be configured such that the cleaning agent contacts at least a portion of an internal surface of exhaust outlet 30 and/or an internal surface of exhaust line 31. In embodiments where system 10 comprises additional feed lines, inlets, outlets, and/or exhaust lines, the system can be configured such that the cleaning agent contacts at least a portion of one or more internal surfaces comprised by any of these features.

As shown in FIG. 1, system 10 can comprise a cold trap 28 for utilization during the processing function of system 10. System 10 can further comprise a pump 32 in fluid communication with trap 28. Conventional processing systems can utilize a cold trap to recover the various reactants and/or byproducts from the processing stage. For example, during particular depositions processing, a cold trap can be provided to condense and/or collect one or more exhaust materials after passing through an exhaust line which is maintained at a sufficiently hot temperature to inhibit condensation of material prior to reaching the cold trap. In particular applications of the present invention, system 10 can be configured such that the cleaning agent passes into cold trap 28. In applications where the cleaning agent comprises a supercritical fluid, cold trap 28 can preferably be maintained at a temperature and a pressure sufficient to maintain the supercritical fluid phase of the agent during cleaning.

The cleaning agent introduced into chamber 12 can pass through outlet 30 and exhaust line 31 into cold trap 28 as shown in FIG. 1. Alternatively, cold trap 28 can be exposed to the cleaning agent independently from other apparatus components by providing the agent directly through a trap feed line 29 or through multiple feed lines (not shown). Independent cleaning of trap 28 can comprise introduction of the cleaning agent into cold trap 28 can comprise separate simultaneous or sequential addition of agent 20 and optional co-agent(s), or can comprise providing a mixture of agent 20 and one or more co-agents as discussed above with respect to introducing cleaning agent into chamber 12.

The cleaning agent can be exhausted from cold trap 28 and can optionally be provided to a recovery vessel 34. In embodiments where the cleaning agent comprises a supercritical fluid, it can be preferable to maintain the supercritical phase for the duration of the existence of the cleaning agent within chamber 12 and/or cold trap 28 to minimize or avoid having materials dissolved therein fall out of solution and deposit within the chamber and/or the cold trap. Once the cleaning agent carrying materials dissolved from internal surfaces of chamber 12 and/or cold trap 28 reaches recovery vessel 34, the supercritical fluid can be released from the supercritical state to remove and or separate solutes and/or other contaminants dispersed within the cleaning agent. The cleaning agent can optionally be separated into its components (agent(s) and co-agent(s)), each of which can optionally be recycled back to corresponding sources 20 and 26.

In particular applications, cold trap 28 which is disposed between chamber 12 and pump 32 in FIG. 1 can be eliminated from system 10 (not shown). Because the cleaning methods of the present invention allow removal of residue material from internal surfaces of tubing or lines, it can be possible to eliminate cold traps from at least some apparatuses. Accordingly, in an absence of cold trap 28 the cleaning agent can be exhausted from chamber 12 (preferably in supercritical phase) and can be provided to recovery vessel 34 without passing through a cold trap. It is to be noted that the invention additionally encompasses exhausting the cleaning agent from chamber 12 into 34 bypassing cold trap 28, even in those systems which include the cold trap.

Cleaning methods of the present invention can be utilized to clean internal surfaces of one or more components of system 10 between each consecutive processing event or after a number of individual events have been performed. Additionally, cleaning methods of the present invention can be combined or alternated with conventional cleaning techniques.

Figure 2:
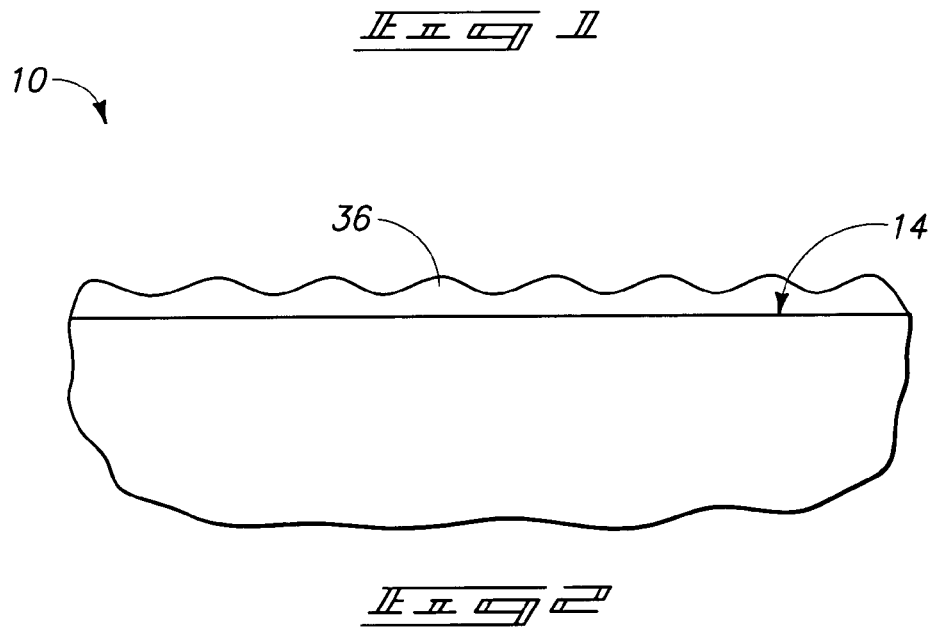
FIG. 2 is a diagrammatic, cross-sectional view of a portion of the system shown in FIG. 1 at a preliminary processing stage of a method of the present invention.

Cleaning of various internal surfaces of system 10 is further described with reference to FIGS. 2-5. Referring initially to FIG. 2, an internal surface such as chamber wall surface 14 can be exposed to various reactants, products, byproducts and/or contaminants during processing events that occur within chamber 12. In particular instances, one or more materials 36 can be deposited onto surface 14. Material 36 can be organic material, inorganic material, or a combination of organic and inorganic materials. Exemplary substances which can be comprised by material 36 include a photoresist, a metallic material, a low-k dielectric, an oxide material, a nitride material, a hydrocarbon material, a carbide material, a polymer material, a chloride material, a fluoride material or a hydroxide material. In particular applications, material 36 can comprise one or more of aluminum oxide, copper, a copper-comprising material, TiN, $Ta_2O_5$, barium strontium titanate (BST), lead zirconate titanate (PZT), strontium bismuth titanate (SBT), $NH_4Cl$, $TiCl_4$, hafnium oxide, zirconium oxide, $WN_x$, W, Pt, a platinum/rhodium alloy, ruthenium, ruthenium oxide, iridium, iridium oxide, HfN, Ta, TaN, aluminum nitride and $Si_xN_y$, for example (where x and y are not limited to any particular value).

Upon completion of the processing event, or alternatively after completion of a series of processing events, one or more portions of system 10 can be subjected to the cleaning process described above. During the cleaning process, material 36 can be contacted by the cleaning agent which can remove some or all of material 36 from surface 14 as shown in FIG. 3. For chamber cleaning purposes, it can be preferable to remove processed wafers from chamber 12 prior to initiating the cleaning treatment. However it is to be noted that processing equipment such as, for example, substrate holder 16 as shown in FIG. 1 can be retained within chamber 12 during the cleaning process. Additional processing equipment may be retained within chamber 12 or can be introduced into chamber 12 prior to initiating the cleaning process (not shown).

As discussed above, internal surfaces of system 10 components that are external to chamber 12 can also be cleaned utilizing methods of the present invention. Referring to FIG. 4, a line 38 having an internal surface 40 can acquire a rescue material 42 over surface 40. Line 38 can be, for example, a feed line or an exhaust line and material 42 can be one or more of a reactant, a product, a byproduct or a contaminant of the processing event. Exemplary substances which can be comprised by material 42 include any of those substances indicated above with respect to residue material 36. In a given system, material 42 can be the same or can differ from material 36 shown in FIG. 2. Material 42 can be contacted with the cleaning agent during cleaning processes as described above. Such contact can remove some or all of material 42 from surface 40 as shown in FIG. 5.

After contacting residue material with the cleaning agent of the invention, the agent can be vented from the system as described above. It can be particularly advantageous to utilize supercritical fluids for cleaning processes according to methods of the invention due to the relative ease of removal of such supercritical fluids from the system. Conventional methods of cleaning systems equipment and/or processing chambers can typically utilize water and or other solvents that are difficult to eliminate entirely from the system.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of cleaning a processing chamber, comprising:

providing a processing chamber having a residue material over at least one internal chamber surface, the residue being formed over the at least one internal surface during one or more processing event conducted within the processing chamber selected from the group consisting of material deposition, etching, annealing, photolithography, ion implantation, and chemical mechanical polishing;

providing a supercritical fluid in the processing chamber, the supercritical fluid comprising at least one of $C_3H_8$, $C_2H_6$, and $CH_4$; and contacting the residue material with the supercritical fluid, the contacting removing at least some of the residue material from over the at least one internal chamber surface.

2. The method of claim 1 wherein the residue material comprises at least one member of the group consisting of, a hydrocarbon, aluminum oxide, copper, a copper-comprising material, TiN, $Ta_2O_5$, barium strontium titanate (BST), lead zirconate titanate (PZT), strontium bismuth titanate (SBT), $NH_4Cl$, $TiCl_4$, hafnium oxide, zirconium oxide, a platinum rhodium alloy, ruthenium, ruthenium oxide, $WN_x$, W, Pt, iridium, iridium oxide, HfN, Ta, TaN, aluminum nitride and $Si_xN_y$.

3. The method of claim 1 wherein the residue material comprises an organic material.

4. The method of claim 1 wherein the residue material comprises an inorganic material.

5. The method of claim 1 wherein the processing chamber is selected from the group consisting of a PVD chamber, a CVD chamber, an ALD chamber, a PECVD chamber, a pulsed-CVD chamber and a high density plasma chamber.

6. The method of claim 1 wherein the at least one internal surface includes a surface comprised by a disperser, a chamber wall or a substrate holder.

7. The method of claim 1 wherein the providing the supercritical fluid comprises flowing a liquid into the processing chamber and generating the supercritical phase from the liquid within the processing chamber.

8. The method of claim 1 wherein the providing the supercritical fluid comprises flowing a gas into the chamber and generating the supercritical fluid from the gas within the processing chamber.

9. The method of claim 1 wherein the providing the supercritical fluid comprises introducing the supercritical fluid into the processing chamber in supercritical phase.

10. The method of claim 1 wherein the supercritical fluid further comprises at least one of $CO_2$, $N_2O$, $H_2O$, Ar and $NH_3$.

11. The method of claim 1 wherein the supercritical fluid contains at least one of a co-solvent and a surf actant dispersed therein.

12. The method of claim 11 wherein the super critical fluid has a polar co-solvent dispersed therein.

13. The method of claim 1 wherein the chamber is maintained at a pressure greater than or equal to the critical pressure of the supercritical fluid throughout the cleaning.

14. The method of claim 1 wherein the chamber is maintained at a temperature greater than or equal to the critical temperature of the supercritical fluid throughout the cleaning.

15. The method of claim 1 wherein the chamber is maintained at a temperature of at least about 31° C. and a pressure of at least about 72.8 atm throughout the cleaning.

* * * * *

UNITED STATES PATENT AND TRADEMARK OFFICE
CERTIFICATE OF CORRECTION

| | | |
|---|---|---|
| PATENT NO. | : 7,323,064 B2 | Page 1 of 1 |
| APPLICATION NO. | : 10/636028 | |
| DATED | : January 29, 2008 | |
| INVENTOR(S) | : Basceri et al. | |

It is certified that error appears in the above-identified patent and that said Letters Patent is hereby corrected as shown below:

In column 8, lines 19-20, in Claim 2, delete "platinum rhodium" and insert -- platinum/rhodium --, therefor.

In column 8, line 49, in Claim 11, delete "surf actant" and insert -- surfactant --, therefor.

Signed and Sealed this

Sixth Day of May, 2008

JON W. DUDAS
*Director of the United States Patent and Trademark Office*